(12) United States Patent
Cannon et al.

(10) Patent No.: US 7,397,692 B1
(45) Date of Patent: Jul. 8, 2008

(54) HIGH PERFORMANCE SINGLE EVENT UPSET HARDENED SRAM CELL

(75) Inventors: Ethan Harrison Cannon, Essex Junction, VT (US); Toshiharu Furukawa, Essex Junction, VT (US); David Vaclav Horak, Essex Junction, VT (US); Charles William Koburger, III, Delmar, NY (US); Jack A. Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 59 days.

(21) Appl. No.: 11/612,809

(22) Filed: Dec. 19, 2006

(51) Int. Cl.
*G11C 11/00* (2006.01)

(52) U.S. Cl. .................. 365/154; 365/149; 365/189.05; 365/200; 365/201; 365/230.08; 711/104; 714/48

(58) Field of Classification Search .................. 365/154, 365/149, 230.08, 189.05, 200, 201; 711/104; 714/48
See application file for complete search history.

(56) References Cited

U.S. PATENT DOCUMENTS

| 4,864,539 | A | | 9/1989 | Chuang et al. | |
|---|---|---|---|---|---|
| 4,912,675 | A | * | 3/1990 | Blake et al. | 365/154 |
| 5,018,102 | A | * | 5/1991 | Houston | 365/95 |
| 5,204,990 | A | | 4/1993 | Blake et al. | |
| 5,504,703 | A | * | 4/1996 | Bansal | 365/156 |
| 5,572,460 | A | * | 11/1996 | Lien | 365/154 |
| 5,905,290 | A | * | 5/1999 | Houston | 257/380 |
| 5,917,212 | A | | 6/1999 | Blake et al. | |
| 7,064,574 | B1 | | 6/2006 | Voogel et al. | |
| 7,109,541 | B2 | * | 9/2006 | Jacquet et al. | 257/296 |
| 7,214,990 | B1 | * | 5/2007 | Lee et al. | 257/369 |
| 7,236,919 | B2 | * | 6/2007 | Fulkerson | 703/16 |

FOREIGN PATENT DOCUMENTS

JP 02-103795 4/1990

* cited by examiner

*Primary Examiner*—Richard T. Elms
*Assistant Examiner*—Eric Wendler
(74) *Attorney, Agent, or Firm*—Schmeiser, Olsen & Watts; Michael J. LeStrange

(57) ABSTRACT

An SRAM cell. The SRAM cell includes a first CMOS inverter and a second CMOS inverter, an input of the first inverter connected to an output of the second inverter and an input of the second inverter connected to an output of the first inverter, a first MOSFET interposed between an output of the first CMOS inverter and a first plate of a first capacitor, a second plate of the first capacitor connected to a high voltage terminal of a power supply; a second MOSFET interposed between an output of the second CMOS inverter and a first plate of a second capacitor, a second plate of the second capacitor connected to the high voltage terminal of the power supply; and a control signal line connected to a gate of the first MOSFET and a gate of the second MOSFET.

8 Claims, 2 Drawing Sheets

_US 7,397,692 B1_

HIGH PERFORMANCE SINGLE EVENT UPSET HARDENED SRAM CELL

FIELD OF THE INVENTION

The present invention relates to the field of integrated circuits; more specifically, it relates to an SRAM cell hardened against single upset events.

BACKGROUND OF THE INVENTION

High performance static random access memory (SRAM) are susceptible to single event upset (SEU) fails which may be caused, in one example, by ionizing radiation striking the SRAM cell. There are several means known in the art for mitigating SEU fails however they involve increasing the size of the SRAM, increasing the power consumption of the SRAM and/or reducing the performance of the SRAM. Accordingly, there exists a need in the art to overcome the deficiencies and limitations described hereinabove.

SUMMARY OF THE INVENTION

A first aspect of the present invention is an SRAM cell, comprising: a first CMOS inverter and a second CMOS inverter, an input of the first inverter connected to an output of the second inverter and an input of the second inverter connected to an output of the first inverter, a first MOSFET interposed between an output of the first CMOS inverter and a first plate of a first capacitor, a second plate of the first capacitor connected to a high voltage terminal of a power supply; a second MOSFET interposed between an output of the second CMOS inverter and a first plate of a second capacitor, a second plate of the second capacitor connected to the high voltage terminal of the power supply; and a control signal line connected to a gate of the first MOSFET and a gate of the second MOSFET.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

VDD is defined as the high voltage terminal of a power supply and GND is defined as the low voltage terminal of the power supply. N-channel field effect transistors (NFETs) and p-channel field effect transistor (PFETs) are complementary types of metal-oxide-silicon field effect transistors (MOSFETs).

Figure 1:
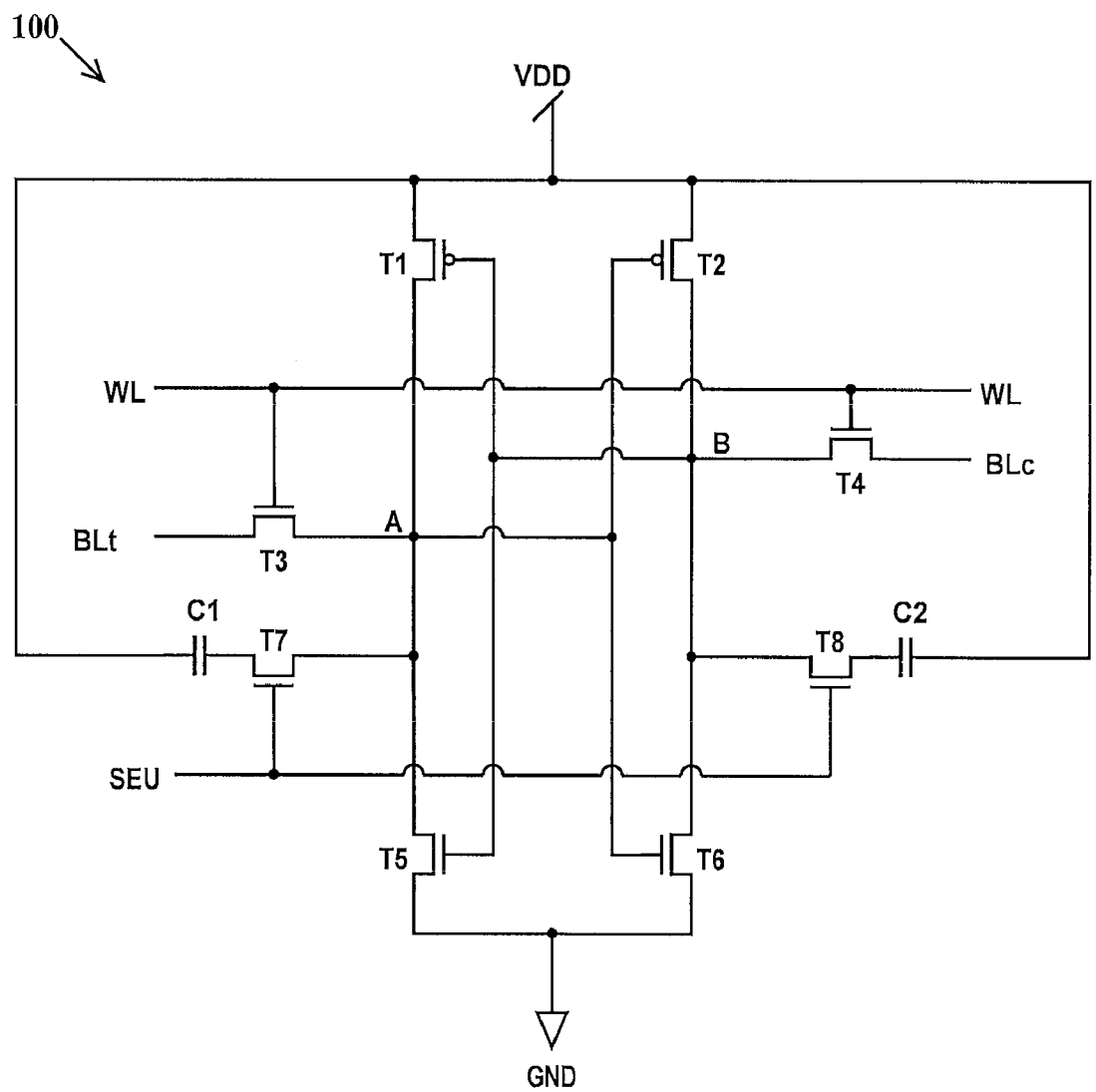
FIG. 1 is a schematic circuit diagram of an SRAM cell according to embodiments of the present invention.

FIG. 1 is a schematic circuit diagram of an SRAM cell according to embodiments of the present invention. In FIG. 1, an SRAM cell 100 includes PFETs T1 and T2, NFETs T3, T4, T5, T6, T7 and T8 and capacitors C1 and C2. The sources of PFETs T1 and T2 and second plates of capacitors C1 and C2 are connected to VDD. The sources of NFETs T5 and T6 are connected to GND. The drains of PFETs T1 and T2 are connected to a bitline true node A and a bitline complement node B respectively. The drains of NFETs T5 and T6 are connected to nodes A and B respectively. The sources of NFETs T7 and T8 are connected to nodes A and B respectively. The drains of NFETs T7 and T8 are connected to respective first plates of capacitors C1 and C2. The gate of PFET T1 is connected to the gate of NFET T5, a first source/drain of NFET T4 and node B. The gate of PFET T2 is connected to the gate of NFET T6, a first source/drain of NFET T3 and node A. Second source/drains of NFETs T3 and T4 are connected respectively to bitlines BLt (bitline true) and BLc (bitline complement). The gates of NFETs T3 and T4 are connected to wordline WL and the gates of NFETs T7 and T8 are connected to a control signal line SEU.

Data bits (0 or 1) are stored on a bitline true node A and on a bitline complement node B. PFET T1 and NFET T5 comprise a first complementary metal-oxide-silicon (CMOS) inverter and PFET T2 and NFET T2 comprise a second CMOS inverter. The inputs and outputs of the first and second inverters are cross-coupled. NFET T7 couples node A to VDD through capacitor C1 in response to a high SEU signal on the gate of NFET T7. NFET T7 decouples the capacitor C1 from node A in response to a low SEU signal on the gate of NFET T7.

When NFETs T7 and T8 are turned on, capacitors C1 and C2 protect nodes A and B of SRAM cell 100 from flipping state when, for example, the drains of NFETs T5 and T6 are struck by ionizing radiation. The read performance (speed) of SRAM cell 100 is not affected by the presence of capacitor C1 and C2. Since the write performance of SRAM 100 would be decreased by C1 and C2, NFETs T7 and T8 are switched off during writes to the SRAM cell. Thus SEU immunity of SRAM cell 100 has been improved compared to conventional SRAM cells without sacrificing write performance.

Figure 2:
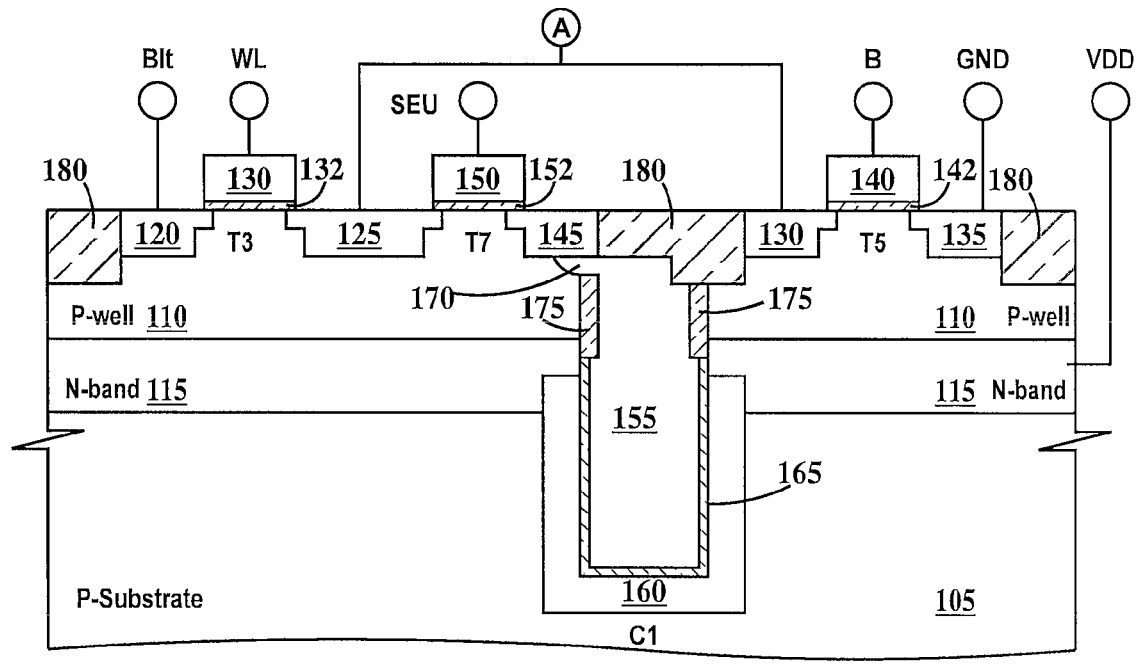
FIG. 2 is a cross-section through a portion of an SRAM cell according to a first embodiment of the present invention.

FIG. 2 is a cross-section through a portion of an SRAM cell according to a first embodiment of the present invention. In FIG. 2, only NFETs T3, T5 and T7, capacitor C1 and nodes A and B are illustrated. NFETs T2, T4 and T8 and capacitor C2 (see FIG. 1) would have similar structures. PFETs T1 and T2 (see FIG. 1) are not illustrated, but would be formed in an N-well.

In FIG. 2, a substrate 105 includes a P-type P-well 110 and an N-type N-band 115 under the P-well. NFET T3 includes a first source/drain 125, a second source/drain 120, a gate 130 and a gate dielectric 132. NFET T5 includes a drain 130, a source 135, a gate 140 and a gate dielectric 142. NFET T7 of FIG. 2 includes a source 125 (common with the first source/drain of NFET T3), a drain 145, a gate 150 and a gate dielectric 152. NFET T7 is a conventional or planar NFET. Capacitor C1 is a trench capacitor. Capacitor C1 includes a N-type doped polysilicon first plate 155 and a diffused N-type second plate 160, separated by a dielectric layer 165. Drain 145 is connected to first plate 155 by a N-type diffused buried strap 170. First plate 155 is electrically isolated from P-well 110 by a thick dielectric collar 175. Drain 145 is electrically isolated from drain 130 by dielectric trench isolation 180. N-band 115 is connected to VDD, second source/drain 120 is connected to BLt, gate 130 is connected to WL, source/drain 125 and drain 130 are connected to node A, source 135 is connected to GND, gate 140 is connected to node B and gate 150 is connected to SEU.

Figure 3:
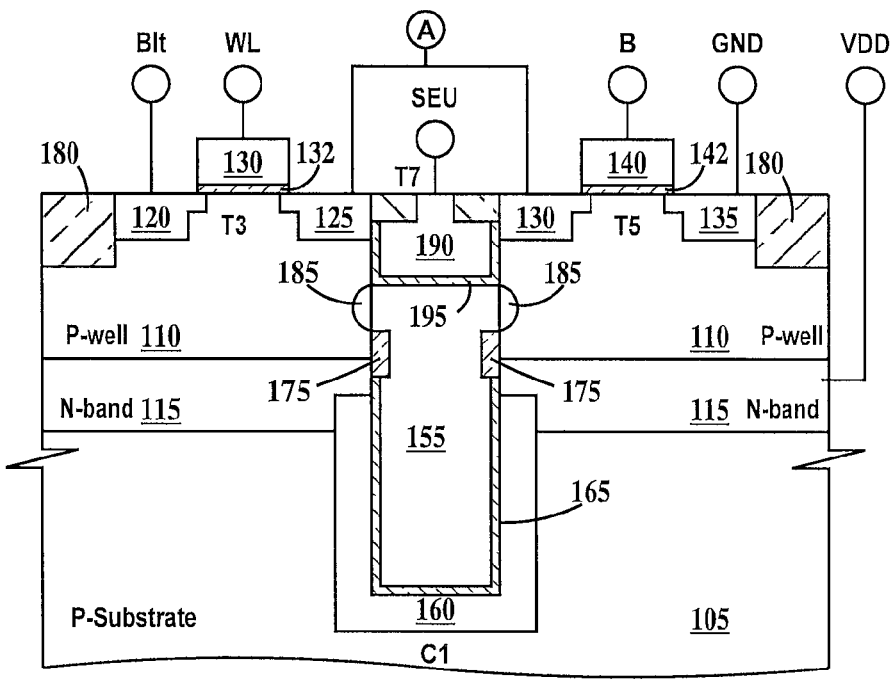
FIG. 3 is a cross-section through a portion of an SRAM cell according to a second embodiment of the present invention.

FIG. 3 is a cross-section through a portion of an SRAM cell according to a second embodiment of the present invention. In FIG. 3, only NFETs T3, T5 and T7, capacitor C1 and nodes A and B are illustrated. NFETs T2, T4 and T8 and capacitor C2 (see FIG. 1) would have similar structures. PFETs T1 and T2 (see FIG. 1) are not illustrated, but would be formed in an N-well. FIG. 3 is similar to FIG. 2 except for the structure of NFET T7. NFET T7 of FIG. 3 is a vertical NFET. NFET T7 of FIG. 3 includes a drain 185, a gate 190 and a gate dielectric 195. The first source/drain 125 and drain 130 also serve as the source of NFET T7. Drain 185 is an out-diffusions of first plate 155. Gate 190 is connected to SEU.

Other types of on-chip capacitors that may be used for capacitors C1 and C2 include thin-film capacitors and FET gate dielectric capacitors. Off-chip capacitors may be used as well.

Thus, the embodiments of the present invention overcome the deficiencies and limitations of the prior art described hereinabove.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. An SRAM cell, comprising:
   a first CMOS inverter and a second CMOS inverter, an input of said first inverter connected to an output of said second inverter and an input of said second inverter connected to an output of said first inverter,
   a first MOSFET interposed between an output of said first CMOS inverter and a first plate of a first capacitor, a second plate of said first capacitor connected to a high voltage terminal of a power supply;
   a second MOSFET interposed between an output of said second CMOS inverter and a first plate of a second capacitor, a second plate of said second capacitor connected to said high voltage terminal of said power supply; and
   a control signal line connected to a gate of said first MOSFET and a gate of said second MOSFET.

2. The SRAM cell of claim 1, further including:
   a first bitline connected to said output of said first inverter through a third MOSFET, a gate of said third MOSFET connected to a wordline; and
   a second bitline connected to said output of said second inverter through a fourth MOSFET, a gate of said fourth MOSFET connected to said wordline.

3. The SRAM cell of claim 1, wherein said first and second MOSFETs are vertical MOSFETs.

4. The SRAM cell of claim 1, wherein said first and second inverters are connected between said high voltage terminal of said power supply and a low voltage terminal of said power supply.

5. The SRAM cell of claim 1, wherein said first and second capacitors are trench capacitors.

6. The SRAM cell of claim 2, wherein said first, second, third and fourth MOSFETs are NFETs.

7. The SRAM cell of claim 6, wherein said first and third MOSFETs have a first common source and said second and fourth MOSFETs have a second common source.

8. The SRAM cell of claim 3, wherein said first and third MOSFETs and a MOSFET of said first inverter have a first common source and said second and fourth MOSFETs and a MOSFET of said second inverter have a second common source.

* * * * *